(12) United States Patent
Chen et al.

(10) Patent No.: US 9,306,136 B2
(45) Date of Patent: Apr. 5, 2016

(54) BAT-WING LENS DESIGN WITH MULTI-DIE

(71) Applicant: TSMC Solid State Lighting Ltd., Hsinchu (TW)

(72) Inventors: Ching-Yi Chen, Hsinchu (TW); Hao-Yu Yang, Yaoyuan (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/303,628

(22) Filed: Jun. 13, 2014

(65) Prior Publication Data

US 2014/0295592 A1    Oct. 2, 2014

Related U.S. Application Data

(62) Division of application No. 13/114,787, filed on May 24, 2011, now Pat. No. 8,759,854.

(51) Int. Cl.
| | |
|---|---|
| *H01L 21/00* | (2006.01) |
| *H01L 33/58* | (2010.01) |
| *H01L 25/075* | (2006.01) |
| *H01L 33/00* | (2010.01) |
| *H01L 33/54* | (2010.01) |

(52) U.S. Cl.
CPC ............ *H01L 33/58* (2013.01); *H01L 25/0753* (2013.01); *H01L 33/005* (2013.01); *H01L 33/54* (2013.01); *H01L 2224/48091* (2013.01); *H01L 2924/01322* (2013.01); *H01L 2924/1305* (2013.01); *H01L 2924/13091* (2013.01); *H01L 2924/1815* (2013.01); *H01L 2933/005* (2013.01)

(58) Field of Classification Search
CPC ........ H01L 33/58; H01L 33/005; H01L 33/54
USPC .......................................................... 438/27
See application file for complete search history.

(56) References Cited

U.S. PATENT DOCUMENTS

| | | | |
|---|---|---|---|
| 7,385,653 B2 * | 6/2008 | Kim et al. ...................... 349/61 |
| 2007/0195534 A1 | 8/2007 | Ha et al. | |
| 2007/0268694 A1 | 11/2007 | Bailey et al. | |
| 2008/0074886 A1 * | 3/2008 | Chang ........................... 362/309 |

* cited by examiner

*Primary Examiner* — Douglas Menz
(74) *Attorney, Agent, or Firm* — Muncy, Geissler, Olds & Lowe, P.C.

(57) ABSTRACT

A batwing beam is produced from an optical emitter having a primary LED lens over a number of LED dies on a package substrate. The LED lens includes a batwing surface formed by rotating a parabolic arc about an end of the parabolic arc over a center of the optical emitter. A center of each of the LED dies is mounted to the package substrate about the focus of a parabola whose arc forms the batwing surface, for example, between about 0.5 to 1.5 of a focal distance from the vertex of the parabola. The batwing surface reflects light from the number of LED dies through total internal reflection (TIR) or through a reflectivity gel coating.

10 Claims, 8 Drawing Sheets

BAT-WING LENS DESIGN WITH MULTI-DIE

PRIORITY DATA

The present application is a divisional application of U.S. patent application Ser. No. 13/114,787, filed on May 24, 2011, entitled "Bat-Wing Lens Design with Multi-Die" now U.S. Pat. No. 8,759,854 issued Jun. 24, 2014, the disclosure of which is hereby incorporated by reference in its entirety.

FIELD

The present disclosure relates generally to a semiconductor device and, more particularly, to semiconductor lighting emitting diodes (LEDs).

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction.

Traditionally, LEDs are made by growing a plurality of light-emitting structures on a growth substrate. The light-emitting structures along with the underlying growth substrate are separated into individual LED dies. At some point before or after the separation, electrodes or conductive pads are added to the each of the LED dies to allow the conduction of electricity across the structure. LED dies are then packaged by adding a package substrate, optional phosphor material, and optics such as lens and reflectors to become an optical emitter.

Optical emitter specifications typically identify application-specific radiation patterns outputted by the optical emitter. A commonly used beam pattern is a batwing beam pattern for illuminating a flat surface, in traffic signal applications, for a backlighting unit in a display, or for general lighting. The batwing beam pattern may be defined by having two roughly equal peaks in a candela distribution plot with a valley between the peaks at about 0 degrees. The batwing pattern may be defined by a uniformity, a viewing angle, a minimum output measured at zero degrees, full width at half maximum (FWHM), and peak angles. The uniformity defines the variability of the light output at different angles within certain angles of interest range, which may be the viewing angle. The viewing angle may be defined as the total angle at which 90% of the total luminous flux is captured. The minimum output at zero degrees is related to the uniformity. The peak angles determine the shape of the batwing and are related to the viewing angle. A full width at half maximum (FWHM) is the width (spatial or angular) of a distribution at half of its maximum value and is usually specified to be greater than about 100 degrees.

Optical emitters are designed to meet these specifications. While existing designs of optical emitters have been able to meet batwing beam pattern requirements, they have not been entirely satisfactory in every aspect. Smaller and more cost effective designs that are easier to manufacture continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
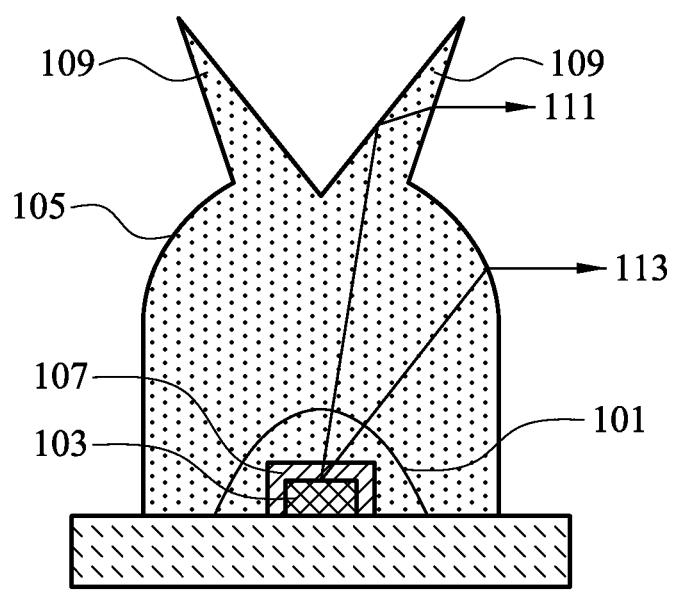
FIG. 1 is a schematic view of an optical emitter using an "onion head" type batwing lens.

One aspect of the present disclosure involves an optical emitter including a number of Light-Emitting Diode (LED) dies, a package substrate attached to one side of the LED dies, electrical connections connecting the LED die and terminals on the package substrate, a molded lens bonded to the package substrate directly contacting the LED die that has a batwing surface centered over the LED dies. The batwing surface is formed by rotating an arc about a line at an end of the arc parallel to a conjugate axis of a curve. A center of each of the plurality of LED dies is mounted to the package substrate around the focus of the curve whose arc forms the batwing surface. The optical emitter outputs a batwing beam pattern through the molded lens.

Another aspect of the present disclosure involves a method of fabricating an optical emitter. The method includes attaching a number of Light-Emitting Diode (LED) dies to a package substrate in a pattern that centers each LED die about a focus of a parabola, electrically connecting the LED die and terminals on the package substrate, molding a lens having a batwing surface over the package substrate and the LED dies. The batwing surface is shaped by rotating an arc of the parabola about a line at an end point of the arc.

These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

An LED package, also referred to herein as an optical emitter, includes one or more LED dies attached to a package substrate, an optional layer of phosphor material coating over the LED die, and some optical components such as reflector and lens. The one or more LED dies are electrically connected to circuitry on the package substrate in a number of ways. One connection method known to the inventors involves attaching the growth substrate portion of the die to the package substrate, and forming electrode pads that are connected to the p-type semiconductor layer and the n-type semiconductor layer in the light-emitting structure on the die, and then bond wiring from the electrode pads to contact pads/terminals on the package substrate. Another connection method known to the inventors involves inverting the LED die and using solder bumps to connect the electrode pads on the light-emitting structure directly to the package substrate. Yet another connection method known to the inventors involves using hybrid connectors. One semiconductor layer, for example the p-type layer, may be wired bonded to the package substrate while the other layer (n-type layer) may be soldered to contacts/terminals on the package substrate. In some optical emitters using multiple LED dies, the LED dies may be connected to the package substrate independently or connected to each other serially with only the end LED dies connected to terminals on the package substrate. There may be one or more serial connections for one optical emitter.

The LED package may include one or more phosphor materials that are usually applied directly onto the LED die (s). Methods of applying the one or more phosphor materials known to the inventors include spraying or dropping the phosphor materials in a concentrated viscous fluid medium, for example, liquid glue, onto the surface of the LED die(s) through which the generated light must pass. As the viscous fluid sets or cures, the phosphor material becomes a part of the LED package.

Optical components such as a reflector and a lens are used to shape the radiation pattern, or beam pattern. Several optical components are often used to achieve a desired pattern, for example, a batwing beam pattern discussed above. A lens may be made of plastic, epoxy, or silicone and is attached to the package substrate by gluing its edge onto the package substrate. Usually, the lens is manufactured separately from the LED die and is available in specific sizes and shapes.

Batwing optical emitters known to the inventors use two lenses to achieve the batwing pattern. A first lens, or primary optics, is a transparent lens attached directly or formed directly on the LED die, as shown in FIG. 1. The first lens 101 is usually a semi-ellipsoid and functions primarily to extract as much light as possible from the LED die 103. A second lens 105, or secondary optics, is fitted and attached over the first lens 101 and serves to shape the beam pattern. Thus, using this method, a variety of beam patterns may be generated by changing the second lens design without changing other portions of the LED package. Light thus generated by the LED die travels through a sapphire growth substrate if the LED is solder bonded to the package substrate, optional layers of phosphor material 107 on the die, through a first lens 101, possibly a gap between the first and the second lens, and finally through a second lens 105. The second lens design for the batwing beam pattern is traditionally that of the "onion head," as pictured in FIG. 1, although other shapes are also available.

The batwing optical emitter shown in FIG. 1, using primary and secondary optics, suffers from several issues with manufacturing, cost, and design. Because the second lens is made separately from the rest of the LED package, it is fitted over the first lens during assembly. Alignment of these optical components affects the resulting beam pattern and thus the tolerance for the alignment is very low. The low tolerance presents manufacturing issues and affects yield. Cost of the batwing optical emitter in FIG. 1 includes two lenses, which renders the batwing optical emitter more expensive than other optical emitters that generate other beam patterns using only one lens. As the LED dies becomes more efficient and its dimensions reduce, the separately-made second lens and the alignment issue makes dimension reduction of the overall LED package difficult. The batwing known to the inventors has a second lens having a dimension of about 10 mm by 10 mm. While smaller second lenses can be made, smaller lenses magnify mis-alignment issues and present handling difficulties during final assembly. Furthermore, the gap between the first and second lens can reduce total light extraction by presenting yet more surfaces for reflection and refraction.

Further, the "onion head" second lens design does not work well with more than one light source (LEDs) under the lens. As shown in FIG. 1, light rays from the LED is reflected off the "sprout" portion of the lens 105 as total internal reflection (TIR) or direct reflection toward the side surfaces of the optical emitter. When more than one LED die is used, the angles of reflection are changes such that the light output from the optical emitter becomes non-uniform at different angles. In other words, less TIR or reflection from the sprout portion occurs because the reflection angles become larger, or less acute. The non-uniformity causes the light output to be different than that of a light output generated from a single LED die. Further, the non-uniformity may also cause the light output to have a different color at different angles, which is less desirable.

As LED-based light sources become more widely used for different lighting applications, higher total light output is increasingly required. While increasing the LED die size can increase total light output, other designs call for using multiple LED dies. For optical emitters using more than one LED die, the second lens design is not suitable. The optical emitter of the present disclosure involves only one lens molded directly over the LED dies, saving the cost and effort of using two lenses while allowing the use of multiple LED dies. The shape of the lens molded is such that a batwing pattern is generated directly through the lens by a number of LED dies.

Figure 2A:
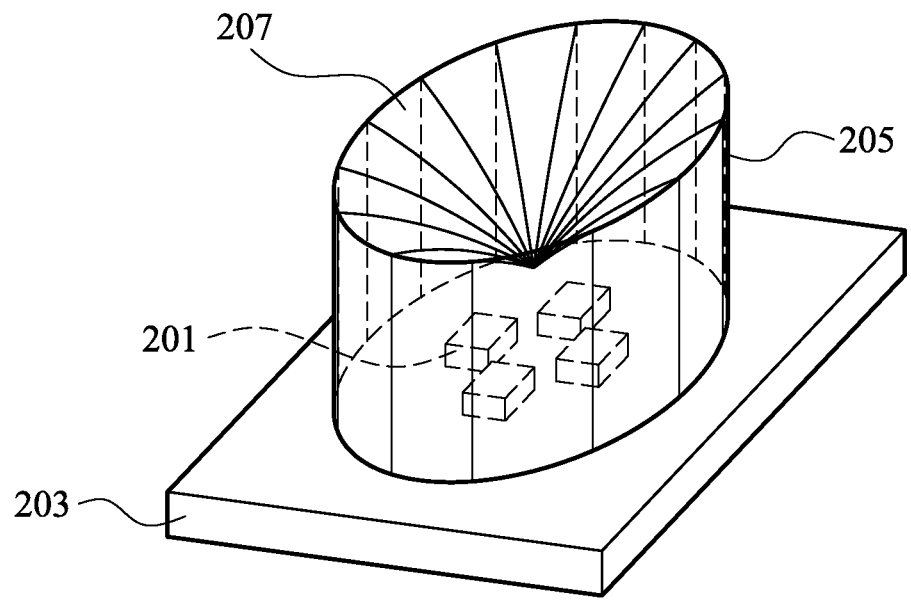
FIGS. 2A and 2B are different views of an optical emitter in accordance with various embodiments of the present disclosure.
Figure 2B:
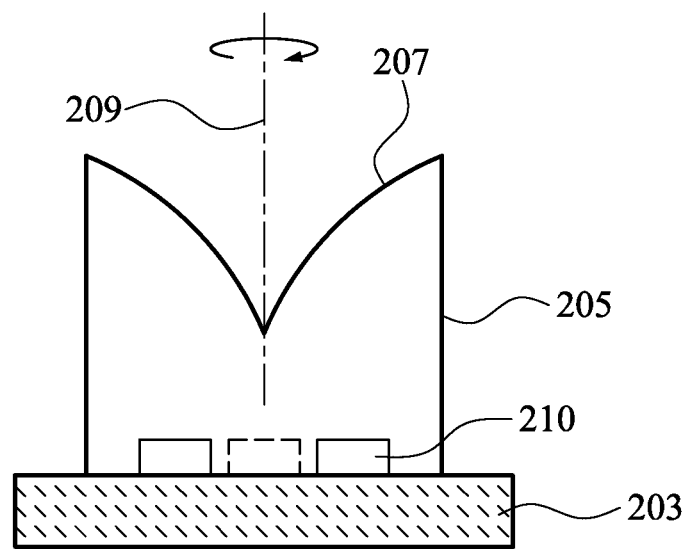

FIGS. 2A and 2B shows the shape of the lens in accordance with various embodiments of the present disclosure. In FIG. 2A, four LED dies 201 are shown attached to a package substrate 203. A lens 205 is attached to the package substrate 203 over the LEDs 201. The lens 205 has a cylindrical body with a batwing surface 207 at the top. FIG. 2B shows a cross section view of the optical emitter of FIG. 2A. The cross section view point is from the middle of the optical emitter, such that the lens and package substrate are cut exactly in half. From this view, only two LED dies are shown. One more LED die is shown in dotted lines because it would be enclosed on the lens material, which is transparent. Note that various electrical connections may exist to connect the LED dies and terminals on the package substrate, but are not shown. Any one of the electrical connection methods mentioned above may be used.

The batwing surface 207 has a curved face that forms a valley with a lowest point at the center and the highest points at the circumferential edge. In a cross section, the batwing surface 207 is formed by two arcs as shown in FIG. 2B. The cross section of the batwing surface 207 through the center is the same at any angle. The batwing surface is formed by rotating an arc about a vertical axis 209 at the end of the arc.

Figure 3:
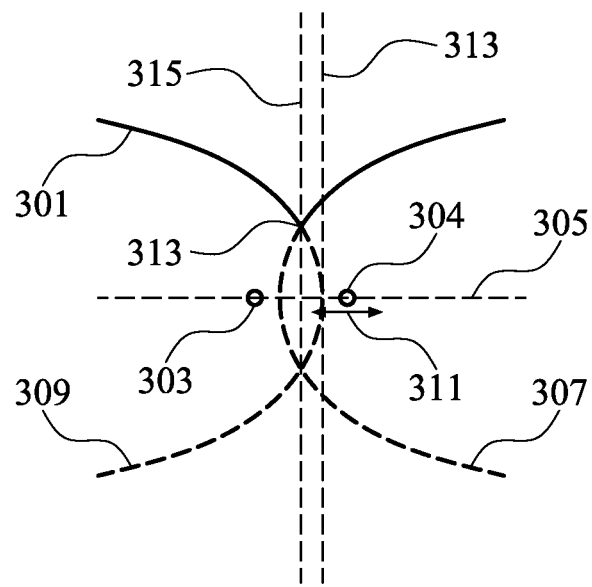
FIG. 3 illustrates arc and curves having a focus for defining the batwing surface for a lens and LED die placement in accordance with various embodiments of the present disclosure.

FIG. 3 illustrates an arc 301 and a curve 309. The arc 301 is a part of the curve 309. The curve 309 has a major axis 305, which cuts the curve into symmetrical portions. The major axis 305 is also referred to as the axis of symmetry 305. The curve also has a minor axis 313, also referred to as the conjugate axis 313 that is perpendicular to the major axis 305 and crosses the major axis at the vertex of the curve 309. The curve may be a parabola or half of a hyperbola. Generally, a parabola is a conic section, the intersection of a right circular conical surface and a plane parallel to a generating straight line of that surface. Given a point (the focus) and a corresponding line (the directrix) on the plane, the locus of points in that plane that are equidistant from them is a parabola. The line perpendicular to the directrix and passing through the focus (that is the line that splits the parabola through the middle) is the "axis of symmetry". The point on the axis of symmetry that intersects the parabola is called the "vertex". The vertex is the point where the curvature is greatest. Parabolas can open up, down, left, right, or in some other arbitrary direction. In the Cartesian coordinates, a horizontal parabola such as the ones illustrated in FIG. 3 may be described by the equation $x=ay^2+bx+c$, with its focus at $(-b2/4a+1/4a,-b/2a)$. The hyperbola is another conic section formed by the intersection of a plane and a cone. The equation of the hyperbola is $(x^2/a^2-y^2/b^2)=1$.

FIG. 3 includes two curves 307 and 309 and an axis of symmetry 305 shared by the curves 307 and 309. Curves 307 and 309 are mirror images of each other across the line 315, which is parallel to the conjugate axis 313. Arc 301 of curve 309 is horizontally rotated about the line 315 to form the batwing surface 207 of FIG. 2A. The line 315 crosses the axis of symmetry 305 between a vertex and a focus of the curve and may be at the vertex or the focus. The curves 307 and 309 have vertices on the axis of symmetry 305, and each has a focus, 303 and 304, respectively. For the optical emitter lens, the point of rotation 313 must be at or above the axis of symmetry 305 so that there is no exposed portion of the package substrate. The arc in accordance with various embodiments of the present disclosure may also be defined as a combination of arcs from different parabolas.

In certain embodiments, the curve is a parabola. The center of each of the plurality of LED dies is mounted to the package substrate about the focus of a parabola whose arc forms the batwing surface. Horizontally along the axis of symmetry, a focal distance is the horizontal distance between the focus and the vertex. The distance between the center of the LED dies to the vertex may be around the focal distance, or between about 0.5 of the focal distance to the vertex to about 1.5 of the focal distance to the vertex, as shown by arrow 311. Optical emitters with LED dies centered at this distance generate a batwing beam output with good light extraction efficiency. The end points of the arrow 311 indicates the range from about 0.5 of the focal distance to about 1.5 of the focal distance. The range of the arrow 311 may be defined more narrowly for better light extraction efficiency. If the curve is a half of a hyperbola, the distance range may be different. Vertically, centers of the LED dies may be about the focus and need not be exactly at the axis of symmetry. The axis of symmetry 305 may be on the top surface of the package substrate, or a line through the LED die or on a top surface of the LED die. Note that the parabolas 307 and 309 do not generally share a vertex unless the rotation point 313 is the vertex.

Figure 4:
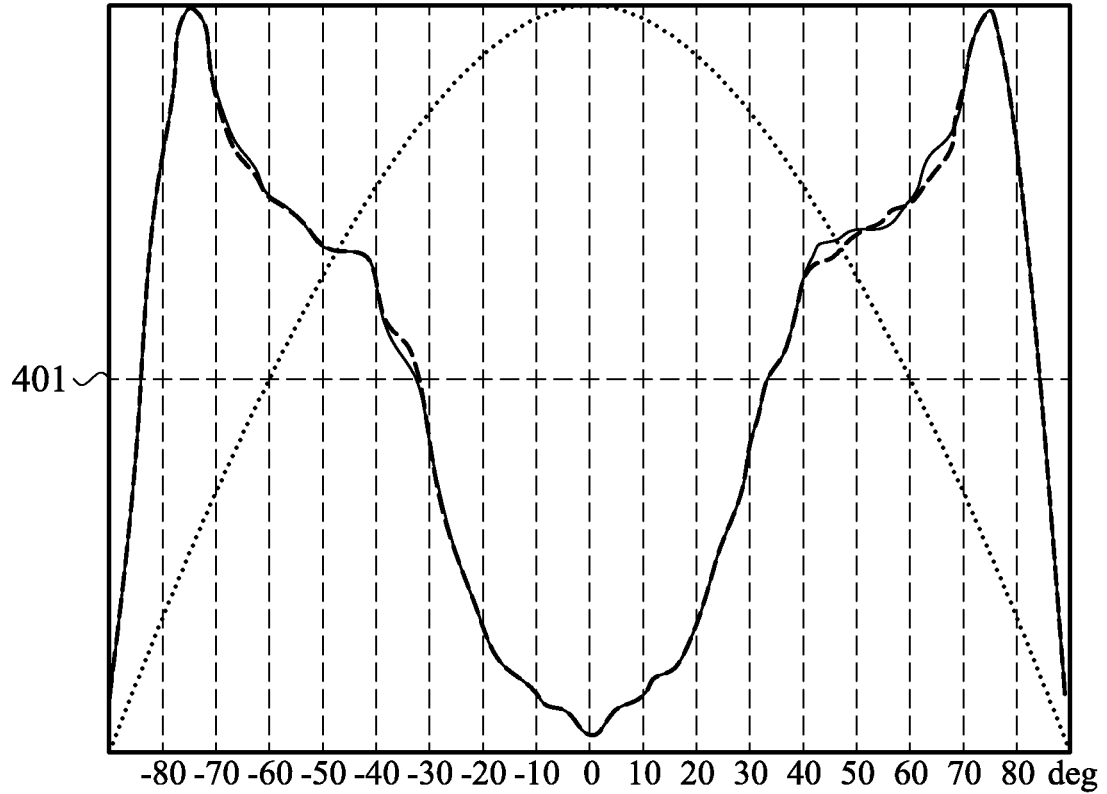
FIG. 4 is a candela distribution curve according to an example configuration of the present disclosure.

FIG. 4 is a rectangular candela distribution plot modeled using a lens in accordance with an embodiment of the present disclosure. The shape of the curve in FIG. 4 is a batwing beam pattern. Modeled using data of a commercially available rectangular LED dies and a molded lens having a general geometry of the lens 205 in FIGS. 2A and 2B, the plot shows light intensity on a surface at two angles, across the modeled LED optical emitter through a horizontal and a vertical line. The modeled values are overlapping for the most part. In other words, for an optical emitter with 4 LED dies, the light output across the horizontal angles and the vertical angles are about the same with the LED dies that are mounted symmetrically.

Along each line, very low intensity or about zero intensity was measured at zero degrees. Each line also shows a typical batwing pattern with two substantially equal peaks roughly equidistant from the valley between the peaks. The batwing pattern may be defined by a uniformity percentage, a viewing angle, a minimum output measured at zero degrees, full width at half maximum (FWHM), and peak angles. These conditions are interrelated. By changing the lens geometry, an optical emitter can be made to satisfy a set of batwing conditions. In FIG. 4, the peak angles are at about −75 degrees and 75 degrees. The curves cross the half maximum line 401 at ±34 degrees and ±84 degrees. The full width at half maximum (FWHM) for the distribution is about 170 degrees, greater than the about 100 degrees usually specified.

Figure 5A:
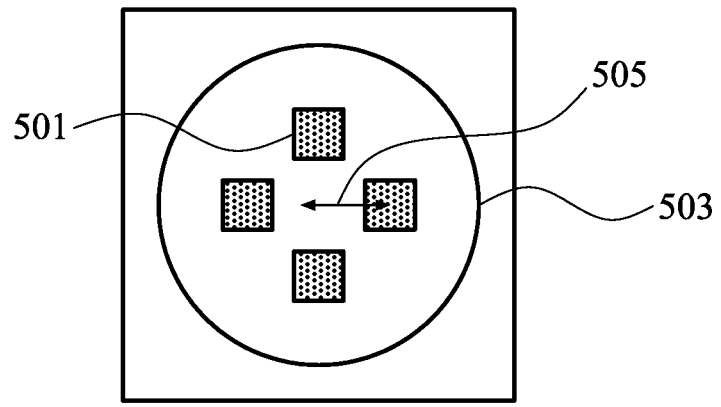
FIGS. 5A-5D illustrate various example configurations in accordance with various embodiments of the present disclosure.

FIGS. 5A to 5D show various LED die configurations of the optical emitter in accordance with various embodiments of the present disclosure. FIG. 5A shows the configuration of the optical emitter in FIGS. 2A and 2B, with four identical LED dies arranged symmetrically about a center of the package substrate. In a symmetrical configuration, the centers of each of the LED dies are equidistance from the center of the package substrate, forming an LED ring. Line 505 indicates the distance between a center of an LED die to the vertex of the curve from which an arc is used to form the batwing surface. This distance is about the focal distance of the curve. If as the arc is rotated, the corresponding focus for the curve is plotted, the focus points would draw a circle (a focus ring) at the plane of the axis of symmetry. When the curve is a parabola, the circle is the focus ring of the rotating parabola. The centers of the LED dies are also said to be around the focus, and may be located 0.5 times the focal distance to about 1.5 times the focal distance from the vertex of the curve. Note that one end of the line 505 is located at the center of the LED die and the other end at the vertex, but the vertex is not necessarily the same as the center of the package substrate.

Figure 5B:
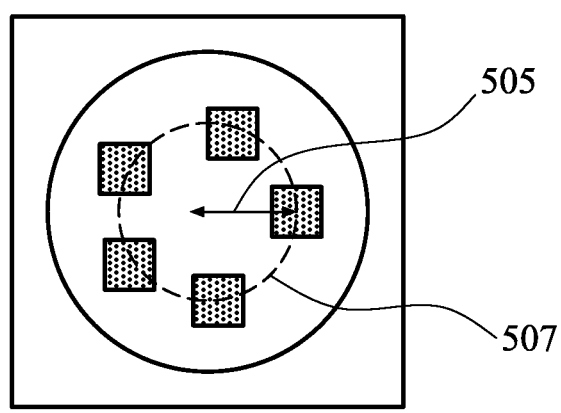

FIG. 5B shows another symmetrical configuration in accordance with various embodiments of the present disclosure where 5 LED dies are mounted on the package substrate. In this example, a circle 507 may be drawn passing through the centers of each of LED dies. In a symmetrical configuration, the 5 LED dies are located 72 degrees apart. Again as in FIG. 5A, the line 505 defines the distance between the LED centers to the vertex of the curve from which an arc is used to form the batwing surface. The length of line 505 is between about 0.5 times the focal distance of the curve to about 1.5 times the focal distance. Similar to the configurations depicted in FIGS. 5A and 5B, any number of LEDs may be used in an optical emitter in accordance with the present disclosure.

Figure 5C:
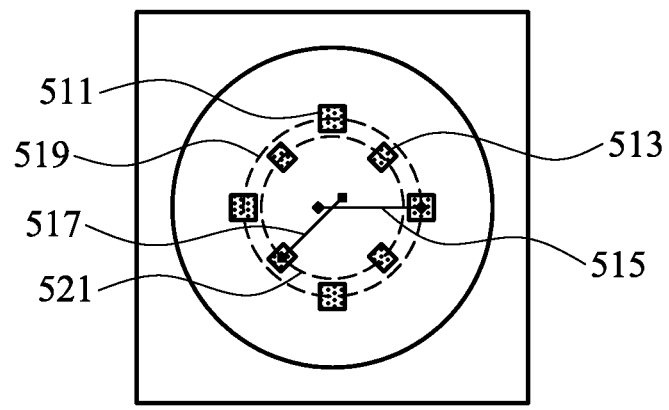

FIG. 5C shows yet another configuration in accordance with various embodiments of the present disclosure, with two rings of LED dies. A first group of LED dies 511 forms a first ring 519 with a distance 515 between the LED die centers and the vertex of the curve. A second group of LED dies 513 forms a second ring 521 with a distance 517 between the LED die centers and the vertex of the curve. In the configuration of FIG. 5C, both distances 515 and 517 are within the range of 0.5 times to 1.5 times the focal distance of the curve.

Figure 5D:
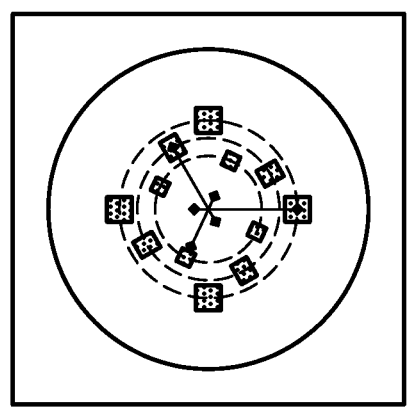

Additional number of rings of LED dies may be added as shown in FIG. 5D (shown with three rings) as long as that all of the LED die centers are located within about 0.5 to about 1.5 times the focal length. Further, the LED dies in different rings need not be the same shape or size, but of course can be all the same shape and size. In order to generate a uniform light output, all LED dies on the same ring should be the same shape and size. However, these concepts may also be used to generate a non-uniform light output, for example, a pattern that has higher intensity peak at the horizontal peak angle but lower intensity peak at the vertical peak angles, or vice versa.

In some embodiments with particular lens designs, the optical emitter includes only one LED die. As discussed herein, a center of the LED die is located within a range of distance around the focus ring the curve. For certain lens geometries where the arc is rotated about a line close to the focus, the center of the lens may be within this range. If so, an LED die mounted on a package substrate and centered below the batwing lens would satisfy the distance range in accordance with various embodiments of the present disclosure. The resulting paraboloid would have a point for a focus ring.

The batwing surface is designed such that light reaching the batwing surface from the LED dies is mostly reflected. The batwing surface may be designed such that the most of the light reaching the surface is reflected as total internal reflection (TIR). TIR is an optical phenomenon that occurs when a ray of light strikes a boundary between two media at an angle larger than a particular critical angle with respect to the normal to the surface. At this larger angle, if the refractive index is lower on the other side of the boundary, no light can pass through and all of the light is reflected. The critical angle is the angle of incidence above which the total internal reflection occurs. If the angle of incidence is greater (i.e. the ray is closer to being parallel to the boundary) than the critical angle—the angle of incidence at which light is refracted such that it travels along the boundary—then the light will stop crossing the boundary altogether and instead be totally reflected back internally. The batwing surface in the lens of the optical emitter in accordance with various embodiments of the present disclosure has a surface that renders most of the angle of incidence greater than the critical angle. Because the refractive index in the cavity is lower (for example, air has a refractive index of about 1) than that of the lens (for example, silicon molding has refractive indices of about 1.4 to 1.55), most of the light from the LED is reflected as TIR.

The batwing surface may also be designed such that most of the light reaching the surface is reflected by a surface coating. A high reflectivity surface coating such as silver or other metals, some metal oxide such as titanium oxide and zinc oxide, or other highly reflective coating may be used. Examples of other highly reflective coatings known to the inventors include dielectric films tuned to reflect the specific wavelengths of light emitted by the LED dies. In some embodiments, the surface coating selected reflects more than 80% of the incident light, about 90% of the incident light, or more than 90% of the incident light.

The batwing surface design may include elements of design for TIR with a reflective surface coating. The reflective surface coating may be designed to reduce reflection for light incident at less than the critical angle. Depending on the beam pattern uniformity requirement or specified modulation depth, more or less of the light may be designed to pass through the batwing surface by changing the surface coating materials. Given the concepts discussed herein, the batwing surface coating can be chosen to achieve any batwing beam pattern for a particular application.

Figure 6:
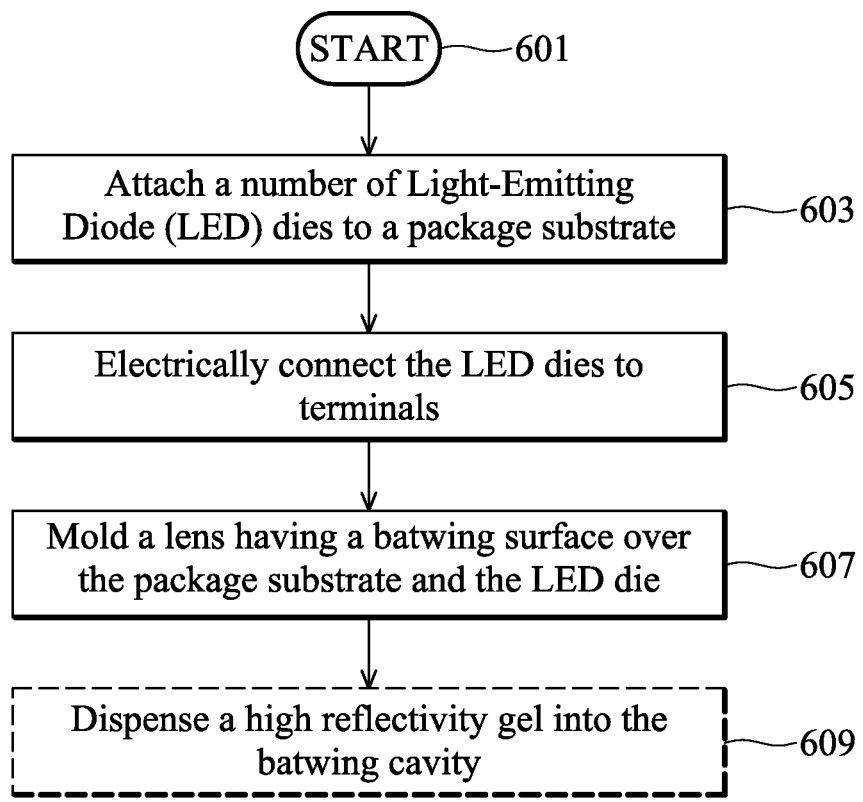
FIG. 6 is a flowchart illustrating a method of fabricating an optical emitter according to various aspects of the present disclosure.

Illustrated in FIG. 6 is a flowchart of a method 601 for fabricating an optical emitter in accordance with the present disclosure. FIGS. 7 to 11 are diagrammatic fragmentary cross-sectional side views of the optical emitter during various fabrication stages in accordance with one embodiment of the method 601 in FIG. 6. The optical emitter may be a standalone device or a part of an integrated circuit (IC) chip or system on chip (SoC) that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors. It is understood that FIGS. 7 to 11 have been simplified for a better understanding of the inventive concepts of the present disclosure. Accordingly, it should be noted that additional processes may be provided before, during, and after the method 601 of FIG. 6, and that some other processes may only be briefly described herein.

Figure 7:
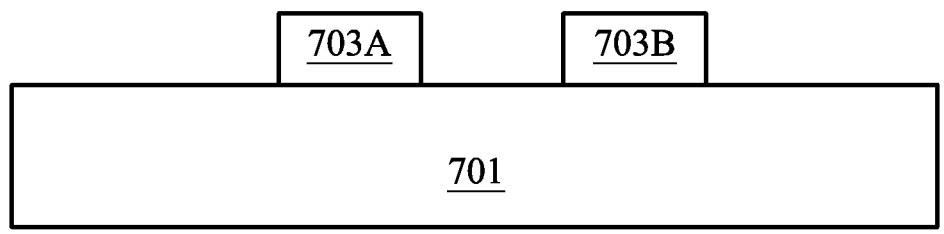
FIGS. 7-11 illustrate cross-sectional views of an optical emitter at various stages of fabrication according to embodiments of the method of FIG. 6.

Referring to FIG. 6, the method 601 begins with block 603 in which a number of Light-Emitting Diode (LED) dies are attached to a package substrate. FIG. 7 shows a cross-sectional view of the LED dies 703A and 703B attached to package substrate 701. An LED die such as 703A and 703B includes a light-emitting structure (not shown) and one or more electrode pads for electrically connecting to a package substrate, the details of which are not shown in FIG. 7. While the following disclosure refers to an optical emitter with blue LEDs, the concepts describes herein could apply to other color LEDs and even those without phosphors. The light-emitting structure has two doped layers and a multiple quantum well layer between the doped layers. The doped layers are oppositely doped semiconductor layers. A first doped layer may be an n-type gallium nitride material, and the second doped layer may be a p-type material. In other examples, the first doped layer is a p-type gallium nitride material, and the second doped layer is an n-type gallium nitride material. The MQW layer includes alternating (or periodic) layers of active material, for example, gallium nitride and indium gallium nitride. For example, in one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth.

The doped layers and the MQW layer are all formed by epitaxial growth processes. After the completion of the epitaxial growth process, a p-n junction (or a p-n diode) is essentially formed. When an electrical voltage is applied between the doped layers, an electrical current flows through the light-emitting structure, and the MQW layer emits light. The color of the light emitted by the MQW layer associated with the wavelength of the emitted radiation, which may be tuned by varying the composition and structure of the materials that make up the MQW layer. The light-emitting structure may optionally include additional layers such as a buffer layer between the substrate and the first doped layer, a reflective layer, and an ohmic contact layer. A suitable buffer layer may be made of an undoped material of the first doped layer or other similar material. A light-reflecting layer may be a metal, such as aluminum, copper, titanium, silver, alloys of these metals, or combinations thereof. An ohmic contact layer may be included in addition or instead of a reflecting layer. The light reflecting layer and ohmic contact layer may be formed by a physical vapor deposition (PVD) process or a chemical vapor deposition (CVD) or other deposition processes.

The LED die may be attached to the package substrate in a number of ways. In certain embodiments where the growth substrate side of the LED die is attached to the package substrate, the attachment may be performed by simply gluing the LED die using any suitable conductive or non-conductive glue. In embodiments where the LED die side opposite of the growth substrate is attached to the package substrate, the attachment may include electrically connecting the LED die by bonding the electrode pads on the LED to contact pads on the package substrate. This bonding may involve soldering or other metal bonding. In some embodiments, the growth substrate is removed and one side of the LED die is bonded and electrically connected to the substrate. In this case, the attaching may be accomplished using metal bonding such as eutectic bonding.

Figure 8:
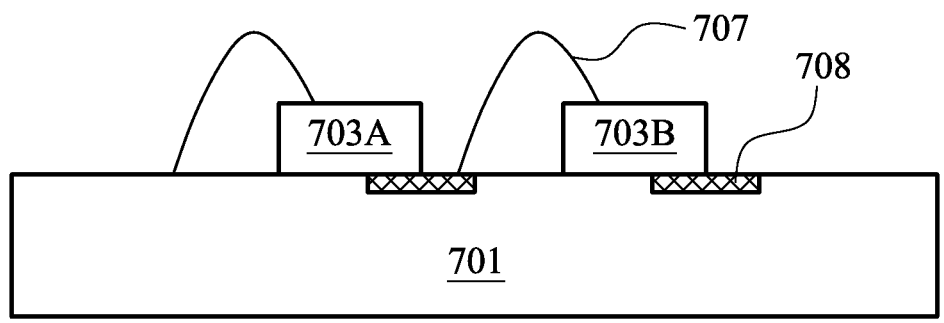

After the LED die is attached to the substrate, the LED die is electrically connected to the package substrate in operation 605 of FIG. 6. At least two electrical connections are made per LED die, one each to the p-type and n-type doped layers. In some cases, two electrical connections are made to the p-type layer in one LED die for current spreading purposes. As discussed, the electrical connection may involve wire bonding, soldering, metal bonding, or a combination of these. The electrical connections may be made to terminals on the package substrate, or to another layer on another LED die. For example, a number of LED dies may be connected serially with only end LEDs connected to terminals on the package substrate. As between any two LEDs, a p-type layer may be connected to an n-type layer or a p-type layer, depending on the device circuit. FIG. 8 shows electrical connections 707 between the LED dies 703A and 703B attached to a package substrate 701. Because the electrical connection 707 may take a variety of forms, the structure shown in FIG. 8 is illustrative only—the electrical connections 707 need not be a wire bond from a contact pad on the package substrate to a top surface of another LED. Other structures where each LED die is individually wired to terminals on the package substrate may also be used.

Referring back to FIG. 6, at operation 607 a lens having a batwing surface is molded over the package substrate and the LED dies. The lens may be formed by injection molding or compression molding. A variety of materials may be used as the lens. Suitable materials have a high optical permissivity (transparency), a viscosity suitable for molding, appropriate adhesion to the package substrate, and good thermal conductivity and stability (i.e., do not degrade or change color during thermal cycling). Example materials include silicone, epoxy, certain polymers, resins and plastics including Poly(methyl methacrylate) (PMMA). Suitable materials are flowable for molding into the lens and can be cured into a defined shape. Some suitable materials may have thermal expansion coefficients that are similar to that of the package substrate and/or can absorb stress caused by a difference in the thermal expansion during thermal cycling. Examples of suitable lens materials include Shin-Etsu's line of SCR and KER silicone resin and rubber materials and Dow Comings' various lines of silicon gels, elastomers, and silicone resins. As understood, a manufacturer in the industry can adjust the refractive index of the lens material as a customer specifies. Thus, one skilled in the art can select a suitable lens material based on suitable material properties other than the refractive index first, and then specify the refractive index within a range that can be supplied by the manufacturer.

Figure 9:
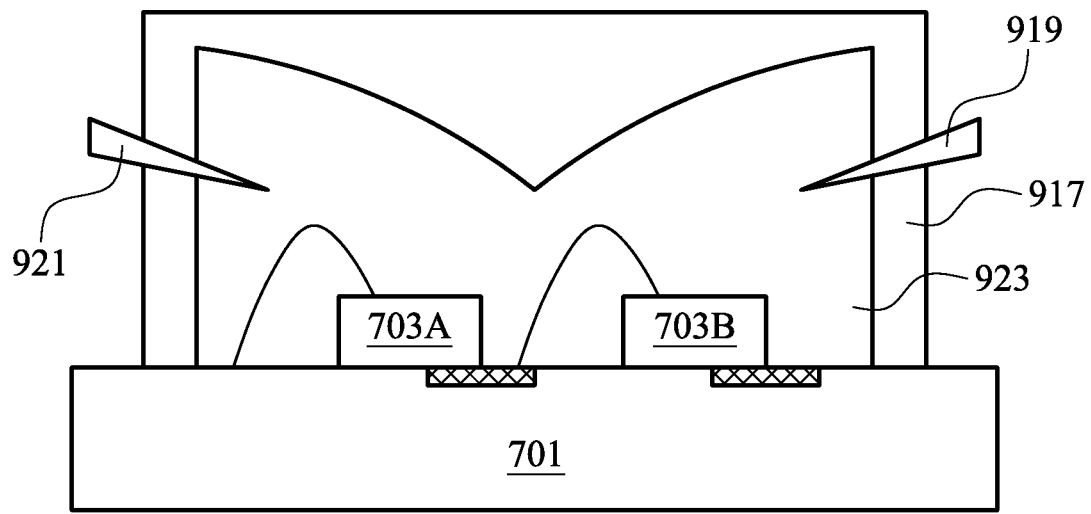
Figure 10:
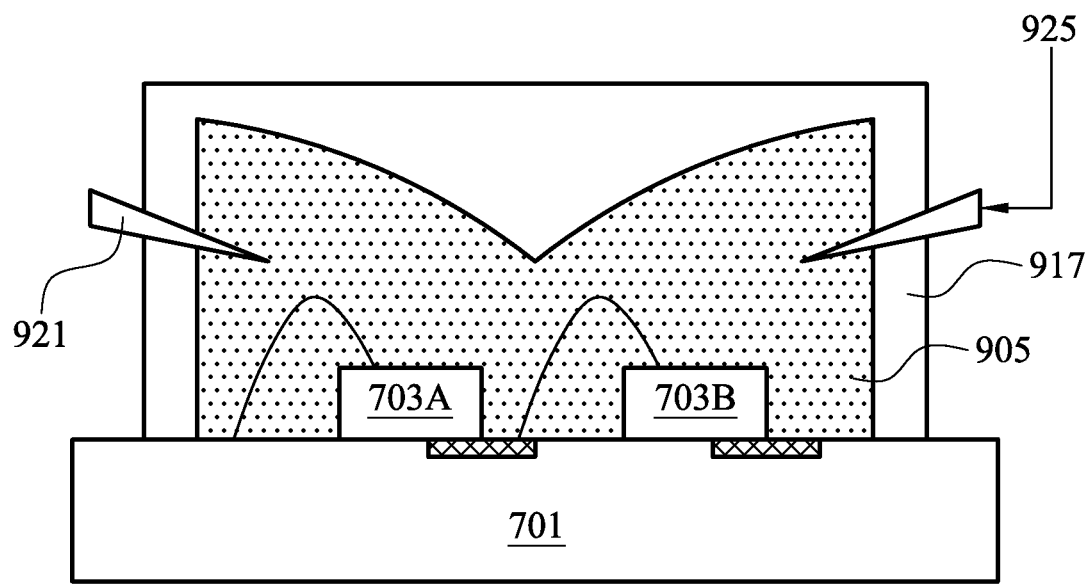
Figure 11:
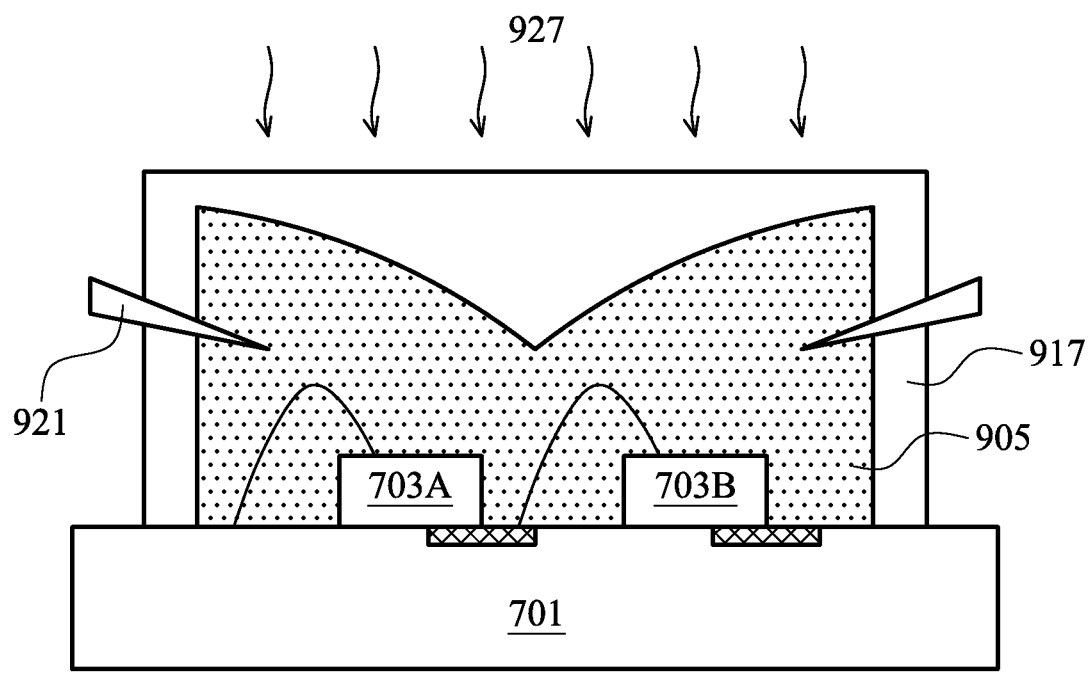

In certain embodiments, an injection molding method is used as shown in FIGS. 9 to 11. Referring to FIG. 9, a lens mold 917 is placed over LED dies 703A and 703B. The lens mold 917 includes multiple openings such as openings 919 and 921. The position and number of opening on the lens mold 917 as depicted is illustrative and not limiting. More openings may be used and the openings may be located at different places. FIG. 9 illustrates one mold cavity 923 placed over LED dies 703A and 703B, however, the lens mold may include multiple mold cavities that would fit over a package substrate having many groups of LED dies such as 703A and 703B attached thereon. The package substrate 701 may include alignment marks between individual LED die groups to ensure that the mold cavities 923 are placed accurately over the LED die groups.

A lens glue or molding material is inserted into the lens mold as illustrated in FIG. 10. The lens glue 925 is inserted or injected into the mold cavity 923. To ensure a good fill, the gas inside the mold cavity 923 may be evacuated through one or more openings 921. The gas inside the mold cavity 923 may be air or an inert gas such as nitrogen. Alternatively, this operation is performed in a vacuum environment, in which instance opening 921 is not used. The lens glue 925 may be heated or under pressure. The lens glue 925 fills the mold cavity 923 to form the lens 905.

The lens 905 is cured to set so that it retains its shape and adheres to the package substrate and LED dies as shown in FIG. 11. Radiation 927 or other energy is applied to the lens mold, and the mold does not interfere with radiation 927. The radiation may be an ultraviolet (UV) radiation, thermal radiation (infrared), microwave, or another radiation that can cure the lens glue. Glue materials that cure under UV light or under heat application are commercially available. In some instances, curing may be accomplished by only thermal energy, which need not be applied in the form of radiation. Conductive heat energy may be applied through the package substrate 701 or through heating of the lens mold 917.

After the lens has cured, the lens mold may be removed. The lens mold 917 is removed so as not to remove the lens 905 from the package substrate 701. In one embodiment, some gas can be added via one or all of the mold openings such as opening 921 to help separate the lens 905 from the lens mold 917. Other techniques include changing the temperature of either the molded lens or the lens mold such that a temperature difference exists or using a removal template in the lens mold 917 before injection of the lens glue. After the lens mold 917 is removed, the optical emitter including a batwing lens is formed as shown in FIG. 2A.

In some embodiments, a compression molding method is used to form the lens. Lens precursor material is applied onto the LED die and a lens mold is fitted over the LED die. Pressure is added to shape the lens precursor material according to the mold cavity. The lens precursor material is then cured to set the lens shape. The lens mold for the compression-molded lens is removed in a similar fashion as the injection-molded lens.

After the lens having a batwing surface is formed on the LED package, the surface may be optionally coated with a reflective material. The surface coating material may be dispensed, sprayed, spun, or otherwise deposited on the cavity internal surface. An example would be to use a gel, for example, a silicon gel, dispensed into the batwing cavity. In some instances the surface coating merely coats the batwing surface. In other instances the surface coating may fill the surface up to the edge of the lens.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    attaching a plurality of light-emitting devices to a substrate;
    forming a lens on the plurality of light-emitting devices directly through a molding process, the lens covering the side surfaces of the plurality of light-emitting devices, wherein the forming of the lens comprises forming an upper surface that is defined by rotating an arc around a vertical axis; and
    thereafter curing the lens,
    wherein the attaching of the plurality of light-emitting devices and the forming of the lens are performed in a manner such that the plurality of light-emitting devices are symmetrically disposed around the vertical axis.

2. The method of claim 1, further comprising applying a reflective material to the upper surface.

3. The method of claim 2, wherein the applying of the reflective material comprises selecting a material that is tuned to reflect a specific wavelength of light emitted by the light-emitting devices.

4. The method of claim 2, wherein the forming of the lens comprises configuring a shape of the lens such that at least 80% of a light emitted by the light-emitting devices is reflected by the reflective material upon reaching the upper surface of the lens.

5. The method of claim 1, wherein the molding process includes an injection molding process.

6. The method of claim 1, wherein the molding process includes a compression molding process.

7. The method of claim 1, wherein the forming of the lens is comprises forming the lens such that it has a vertex.

8. The method of claim 7, wherein the forming of the lens is performed in a manner such that the arc is a parabola or a hyperbola.

9. The method of claim 7, wherein a horizontal distance between the vertex and a focus of the parabola defines a focal distance, and wherein a distance between a center of the light-emitting devices to the vertex is in a range from about 0.5 times the focal distance to about 1.5 times the focal distance.

10. The method of claim 1, wherein the attaching of the plurality of light-emitting devices comprises forming at least two concentrically-located rings of light-emitting devices.

* * * * *